United States Patent [19]
Bennett et al.

[11] 4,048,048
[45] Sept. 13, 1977

[54] APPARATUS FOR MAKING A MEMORY WIRE

[75] Inventors: Charles Bennett, Framingham; Emil Toledo, Newton, both of Mass.

[73] Assignee: The United States of America as represented by the Secretary of the Navy, Washington, D.C.

[21] Appl. No.: 674,356

[22] Filed: Apr. 7, 1976

Related U.S. Application Data

[62] Division of Ser. No. 501,305, Aug. 28, 1974, Pat. No. 3,982,235.

[51] Int. Cl.$^2$ ............... C25D 17/00; C25D 17/12
[52] U.S. Cl. .......................... 204/279; 204/DIG. 8; 204/28; 204/129; 204/43; 204/206; 204/211; 204/280
[58] Field of Search ............... 204/28, 129.43, 206, 204/211, DIG. 8, 279, 280

[56] References Cited
U.S. PATENT DOCUMENTS

| 3,639,217 | 2/1972 | Shukovsky et al. | 204/129.43 X |
| 3,847,759 | 11/1974 | Toledo | 204/28 |

Primary Examiner—G. L. Kaplan
Attorney, Agent, or Firm—R. Sciascia; R. Beers; S. Sheinbein

[57] ABSTRACT

Synchronous plating techniques for reducing adjacent bit disturb characteristics or interactions in a magnetic memory wire include the step of sinusoidally and smoothly depositing the magnetic layer on the outer surface of the wire so as to increase the effective magnetic path length between adjacent bits. The resultant wire has changing cross-sectional dimensions corresponding to the varying sinusoidal configuration of the wire.

This invention concerns a film-plated memory wire of improved characteristics and the method of making the same. The term "memory wire" is used to designate a magnetic recording and reproducing element for recording or reproducing magnetic signals by magnetic flat interlinkage with a magnetic transducer head during relative motion of the wire and head.

1 Claim, 5 Drawing Figures

APPARATUS FOR MAKING A MEMORY WIRE

This is a division of application Ser. No. 501,305, filed Aug. 28, 1974, now U.S. Pat. No. 3,982,235.

BACKGROUND OF THE INVENTION

An example of a film-plated memory wire is disclosed in U.S. Pat. No. 3,736,576. Known types of film-plated memory wires are of uniform diameter throughout the length thereof with a very smooth surface in order to realize as large an output voltage from the wire as possible. The memory wire of the present invention is made to have a controlled roughness in order to improve the adjacent bit disturb characteristics of the continuously plated wire. This textured surface increases the effective distance between adjacent bits and thus reduces the creep tendency. One drawback in the use of a textured surface is that a lower output voltage is obtainable from the wire.

According to the present invention, techniques are employed which increase the effective "distance" between adjacent bits of the memory wire while maintaining a smooth surface without sacrifice of output voltage. Stated another way, in the film-plated wire of the present invention the magnetic path length as measured along the wire surface in a longitudinal cross-section of the memory wire is longer than that of a normal known type plated-wire of smooth surface having a straight line magnetic path.

The terminology "adjacent bits" refers to adjacent areas of the wire used to store information magnetically. In plated memory wire which has its magnetic layer (or layers) deposited in a continuous manner, adjacent storage areas of the wire have a tendency to interact or disturb the stored value of each other, and this tendency is referred to as "bit disturb". The level and sense (or direction) of magnetization of a specific storage area can be "written" at such a magnitude as to impinge or "creep" into the adjacent magnetized area.

BRIEF SUMMARY OF INVENTION

The invention can be characterized as a novel continuously plated wire of continuously varying diameter suitable for use as a memory element, and novel methods or techniques for producing such a wire to achieve (1) improved "bit disturb" characterstics (2) increased output voltage therefrom comparable to a continuously plated wire of uniform diameter, and (3) a reduction in creep tendency of the wire. The foregoing end results are, so far as Applicant is aware, unavailable with known techniques. The techniques of the invention include operating on the surface of the wire by superimposing an alternating current at the plating and/or polishing stage(s) to create a ringed cross-section of the wire to effectively increase the surface magnetic path length between adjacent bits — a wire of periodically varying diameters along its length.

BRIEF DESCRIPTION OF DRAWINGS

A more detailed description of the invention follows in conjunction with a drawing, wherein.

DETAILED DESCRIPTION

Figure 1:
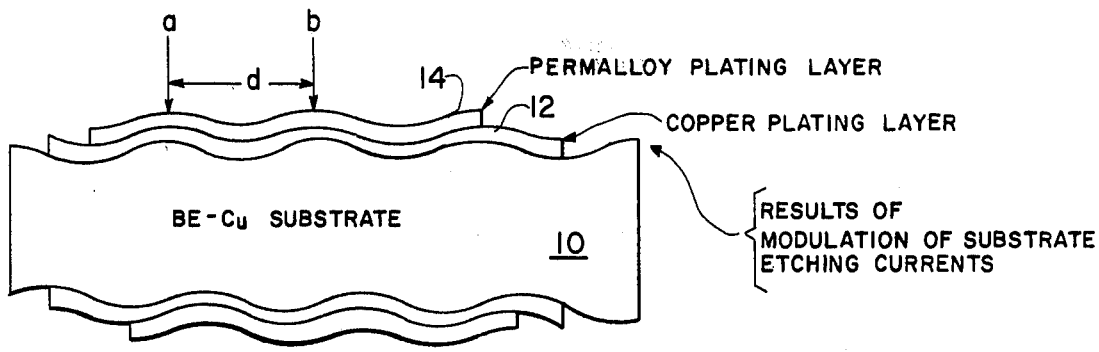
FIGS. 1, 2 and 3 illustrate diagrammatically longitudinal cross-sections of different embodiments of the continuously plated wire of the invention.
Figure 2:
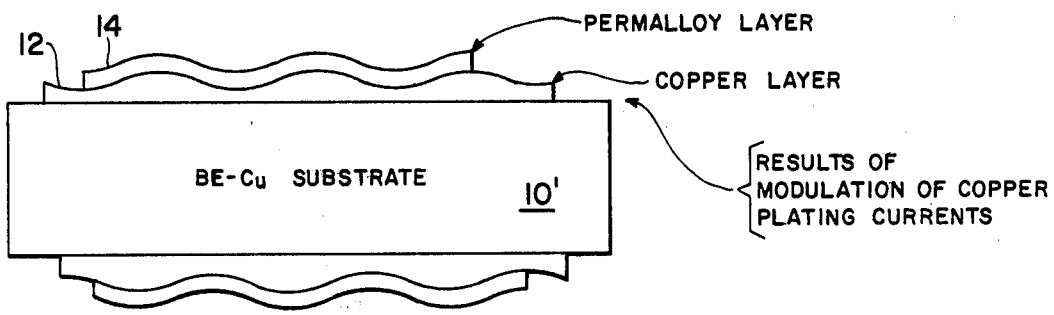
Figure 3:
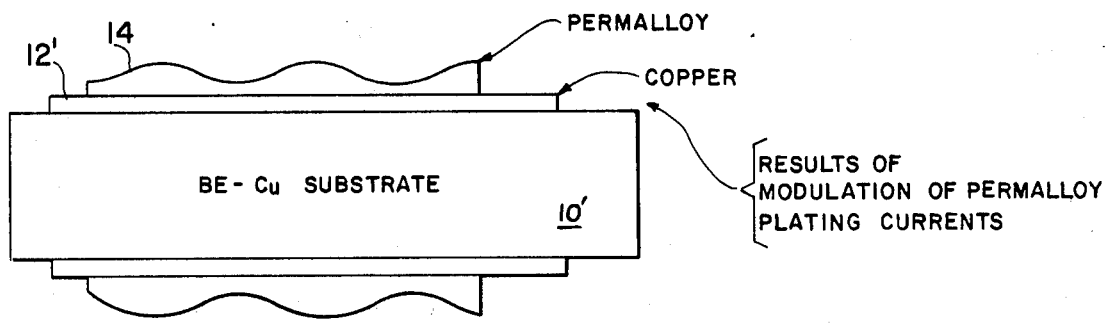

FIGS. 1, 2 and 3 show three different embodiments of the plated wire of the invention in longitudinal cross-section illustrating periodically recurring peaks and valleys of the wire surface, resulting in an increase in the magnetic path length or effective distance between adjacent bits as contrasted to the "normal" plated wire of uniform diameter which has a linear magnetic path. The result of the increase in magnetic path length or effective distance between adjacent bits is to diminish the "bit disturb" and "creep" tendency. The controlled smooth sinusoidal-like transitions between peaks and valleys of the plated wire of the invention results in gaining back the loss in developed output voltage which is characteristic of a textured or rough surface on the memory wire.

The three areas or stages in which the surface of the plated wire of the invention may undergo changes are: (1) At the electropolishing stage where a percentage of the surface of the substrate is polished away thus removing most of the surface defects. (2) At the copper plating stage where copper is plated on the polished surface to cover any remaining defects missed by the polishing stage, and (3) At the permalloy plating stage or stages where the final magnetic coating is added. In each of the foregoing three stages the action that takes place is made to be as uniform and regular as possible. In the electro-polishing stage the wire (the anode) passes through a long cylindrical cathode across which there exists a potential as to create a D.C. polishing current, thereby removing a percentage of the wire surface. In the copper plating stage, the wire becomes the cathode in the plating action, which is again meant to apply a uniform plating of copper on the surface of the wire by means of a D.C. plating current. A similar plating action takes place at the permalloy plating stages.

The technique employed in the present invention is to operate on the surface of the wire by superimposing an alternating current at the plating and/or polishing stage or stages in a novel manner so as to create a ringed cross-section; that is, transverse cross-sections of periodically varying diameters in sinusoidal fashion along the length of the wire, to thereby effectively increase the surface magnetic path length (as distinguished from linear magnetic path) between adjacent bits. The sinusoidally defined cross-section is the means by which the magnetic path length is increased over the normally linear path length of "normal" deposition techniques.

The memory wire of the invention having three different ringed effects are shown in longitudinal cross-section in FIGS. 1, 2, 3.

In FIG. 1, the non-magnetic beryllium-copper substrate (be-cu) 10, the next adjacent copper plating layer 12 and the exterior magnetic permalloy plating layer 14 constitute a lamination of layers all of which vary in diameter in sinusoidal fashion along the length of the composite wire. The effective magnetic path length along the surface of the layers between adjacent bits or peaks $a$ and $b$ is greater than the linear magnetic path or peak-to-peak distance $d$. The peaks are the result of a sinusoidal plating (or etching) current. This greater or increased magnetic distance along the wire surface resulting from the techniques of the present invention, as contrasted to the "normal" linear magnetic path length

*d* on the outer surface of known types of memory wire of uniform diameter throughout its length, results in reduced interaction between adjacent bits with improved "bit disturb" characteristics, and reduction in creep tendency with negligible, if any, loss in developed output voltage from the wire.

The magnetic permalloy layer 14 actually comprises in practice, two superimposed layers, 30 and 31. The first permalloy layer 30 adjacent the copper layer is a film of 3-5% cobalt permalloy with a high anistropy of over 6 Oersteds while the second permalloy layer 31 is a film of 0-0.5% cobalt permalloy with a low anistropy of less than 4 Oersteds.

FIG. 2 is another memory wire embodiment of the present invention which differs from that of FIG. 1 in that the Be-Cu substrate 10' has a uniform cross-sectional area throughout its length as compared to the sinusoidally varying or defined cross-section of the substrate 10.

The embodiment of FIG. 3 shows the substrate 10' and the copper plating layer 12' to be of uniform cross-section throughout the length of the memory wire while the outer permalloy layer or layers 14 has the sinusoidally defined cross-section or rippled effect.

The memory wires of FIGS. 1, 2 and 3 of the invention have non-uniform magnetic properties along the length of the wire due to the rippled or sinusoidally varying surface effect of the wire.

By way of illustration, the average diameter of a thin wire as shown in FIGS. 1, 2 and 3 may be 5 mils, the thickness of the copper plating layer 12 or 12' may be 1 mil, and the thickness of the first and second permalloy layers comprising the composite permalloy layer 14 may be 0.2 to 0.225 mils each. The copper layer has fine to medium grains with desired controlled variations.

Figure 4:
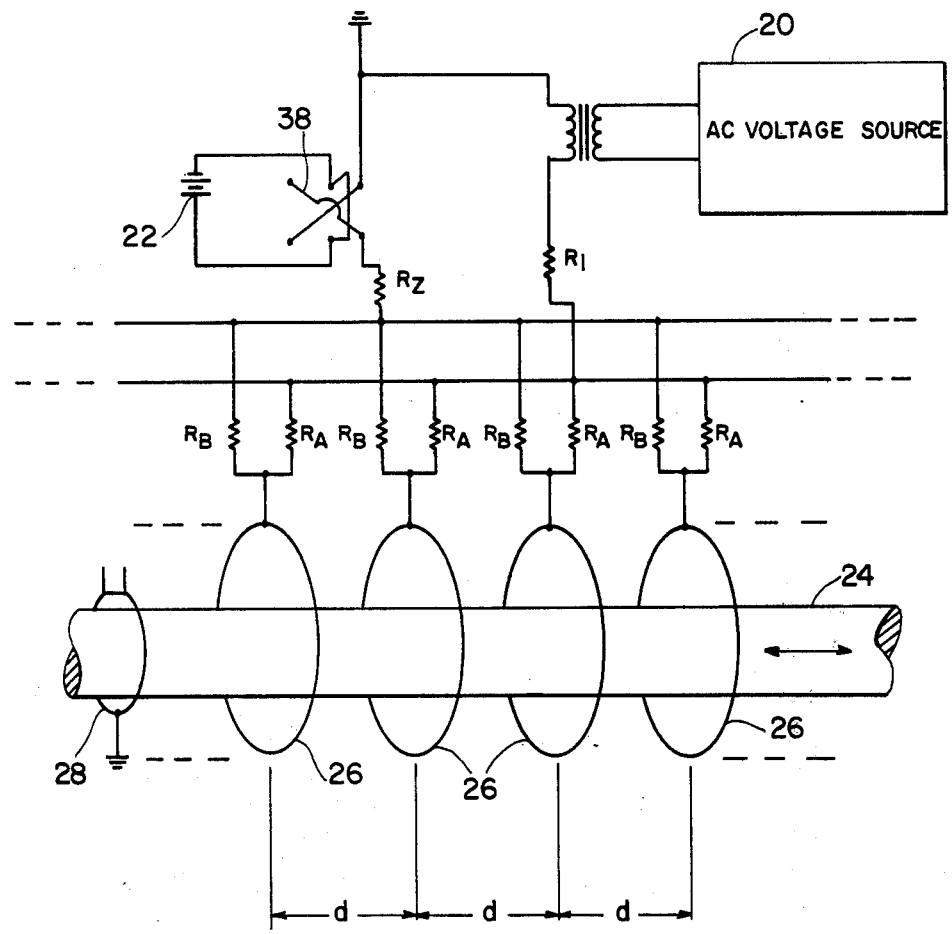
FIG. 4 illustrates a technique by which the memory wire of the invention can be made.

FIG. 4 is a schematic diagram illustrating the plating circuits which may be used in the synchronous plating techniques of the present invention for depositing the copper layer and the permalloy layer. The alternating current 60 cycle A.C. voltage source 20 is arranged in parallel relation to the D.C. voltage source 22 and is superimposed thereon. The A.C. component of plating current is perfectly symmetrical with equal plus and minus peaks defined sinusoidally. The wire 24 when it is at negative polarity relative to the anode rings 26 is a cathode element in the copper plating action. A similar plating action takes place at the permalloy plating stages. The wire 24 travels through and past spaced metal anode rings 26 which are spaced apart by equal distances *d* and which are separately supplied with the D.C. and superimposed A.C. currents from sources 22 and 20 respectively, over resistors R1, R2, RB and RA, as shown. The path of travel can be longitudinally in either direction. Conventional speed synchronizing means (not shown) operate to control the speed of wire 24 through the plating and etching steps such that the speed of the wire is synchronized to the AC voltage source 20. The anode rings and the wire are totally immersed in the bath. A mercury wire contact pool 28 at ground potential makes electrical contact with the wire as the wire advances in its path of travel. At a wire traveling speed of 20 inches a minute, the values of the copper plating current may be as follows: D.C. component 300 ma (milliamperes); A.C. component 75 ma (milliamperes). The time in the plating bath may be 6 seconds.

By throwing the polarity reversing switch 38 to the right the anode rings are maintained at a positive potential relative to wire 24. The pure copper 12 (or the permalloy magnetic material 14) is electrodeposited on the non-magnetic beryllium-copper core, and the magnitude of deposit is a function of speed of travel of the wire. At any instant of time, for example when the greatest magnitude of voltage in a cycle (D.C. plus A.C.) in on an anode ring, there will be the greatest deposition of material on the traveling wire. At the location of lowest magnitude of voltage along the wire at ths same instant of time the deposition of material on the wire is less. As the wire moves in synchronism with the 60 cycle current there is an accumulation or build up sinusoidally to provide the peaks at some (but always the same) locations on the wire, and valleys or smallest amount of build up at other locations.

FIG. 4 is the circuit chosen to illustrate the option for producing the memory wire of FIG. 2. Where a polishing or etching is desired to synchronously remove material from, for example, the substrate, then the polarity of the D.C. source 22 is reversed as for example by the polarity reversing switch 38 in which case the anode rings become negative with respect to ground or the traveling wire. This polishing action is often desired on the substrate to remove defects, such as die marks on the substrate due to extrusion by reducing the diameter of the substrate.

The spacing *d* in FIG. 4 is an indication of the locations where a 60 cycle superimposed component of plating current will form the peaks along the wire in synchronism with the wire speed of motion. At a wire speed of twenty inches per minute and a superimposed 60 cycle plating current, the peaks (as shown in the embodiments of FIGS. 1 to 3) will form at intervals of 5.555 mils. For this to take place, the anode rings 25 must also be placed 5.555 mils apart. The peak-to-valley spacing ratio is changed simply by changing the values of the D.C. and A.C. currents used and becomes totally variable. For a peak-to-valley change of 0.5 mils spaced 5 mils apart (linear distance between peaks) an effective bit-to-bit increase of 14% has been obtained. The wire may move past the plating bath using an electrolyte as described for example in U.S. Pat. No. 3,736,576, May 29, 1973. Modulating plating currents are employed in novel manner in the techniques of the present invention instead of continuous plating currents.

In processing a 10 foot line in which the wire moves at 20 inches per minute, the length of time in each stage of the technique process of the invention may be as follows.

Figure 5:
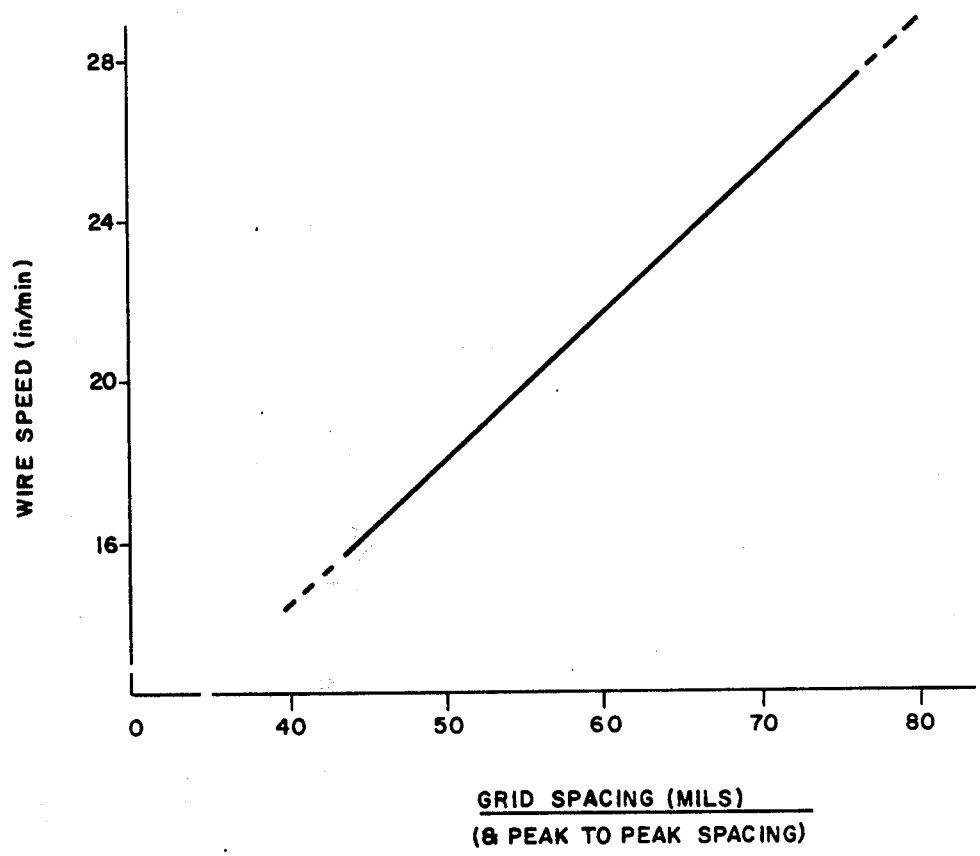
FIG. 5 is a chart defining the relationship of wire speed, anode grid or "rings spacing" (and the resultant peak-to-peak distances) with respect to the 60 cycle superimposed a.s. component of plating current.

Electropolishing: 40 seconds
Copper plating: 6 seconds
First permalloy: 3 seconds
Second permalloy: 3 seconds
Heat treatment: 150 seconds
Automatic testing: 10 seconds FIG. 5 is a chart defining the relationship of wire speed, anode grid or rings spacing (and the resultant peak-to-peak distances) with respect to the 60 cycle superimposed A.C. component of plating current. To define the required wire speed shown in the ordinate values of the chart, it is only necessary to select the ring spacing shown on the abscissa of the chart, move vertically to a point on the diagonal line, then with such a point selected on the diagonal line move to the left at right angles to the ordinate to find the necessary wire speed. It should be understood that for a different frequency of the superimposed AC plating (or etching) current, a different graph of wire speed versus grid speed will result, i.e., the wire speed of travel is synchronized with the AC current.

Obviously, may modifications and variations of the present invention are possible in light of the above teachings. It is therefore to be understood that, within the scope of the appended claims, the invention may be practiced otherwise than as specifically described.

What is claimed is:

1. An electrical circuit for the electrodeposition of metal on a wire or for the removal of metal from the surface of a wire, comprising a plurality of physically spaced ring-like electrodes adapted to be immersed in an electrolyte and through which the wire is adapted to progressively pass, a source of D.C. potential, a source of A.C. potential, and connections for connecting said sources in electrically parallel relation and for applying equal values of the resultant potential to said ring-like electrodes, a reversing switch having contacts connected to said source of D.C. for reversing the polarity of said source of D.C. with respect to said ring-like electrodes, and a mercury contact pool at ground potential arranged in line with but to one side of said ring-like electrodes for grounding said wire as it advances through said electrodes.

* * * * *